United States Patent
Mishima et al.

(10) Patent No.: US 7,205,523 B2
(45) Date of Patent: Apr. 17, 2007

(54) SOLID STATE IMAGE PICKUP DEVICE, METHOD OF MANUFACTURING THE SAME, AND CAMERA

(75) Inventors: Ryuichi Mishima, Machida (JP); Seiichi Tamura, Yokohama (JP); Koichi Tazoe, Hadano (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 11/369,819

(22) Filed: Mar. 8, 2006

(65) Prior Publication Data

US 2006/0208160 A1  Sep. 21, 2006

(30) Foreign Application Priority Data

Mar. 18, 2005  (JP)  ............................. 2005-080346

(51) Int. Cl.
*H01L 27/00* (2006.01)
*H01L 31/00* (2006.01)

(52) U.S. Cl. .................. 250/208.1; 257/445; 348/299; 348/314

(58) Field of Classification Search ............. 250/208.1, 250/214.1; 257/291, 292, 223, 230, 445, 257/446; 348/299, 303, 314

See application file for complete search history.

(56) References Cited

U.S. PATENT DOCUMENTS

2006/0208159 A1* 9/2006 Nishimura ............... 250/208.1

* cited by examiner

*Primary Examiner*—Kevin Pyo
(74) *Attorney, Agent, or Firm*—Fitzpatrick, Cella, Harper & Scinto

(57) ABSTRACT

The solid state image pickup device includes a pixel, the pixel including: a photoelectric conversion region for generating carrier by photoelectric conversion and accumulating the carrier; a carrier holding region for accumulating carrier flowing out from the photoelectric conversion region during the photoelectric conversion region generates and accumulates carrier; a source follower amplifier SF-MOS for amplifying carrier; a transfer MOS transistor Tx-MOS for transferring the carrier accumulated in the photoelectric conversion region to the source follower amplifier SF-MOS; and a transfer MOS transistor Ty-MOS for transferring the carrier accumulated in the carrier holding region to the source follower amplifier SF-MOS. The carrier holding region is formed so as to have a trench structure.

8 Claims, 9 Drawing Sheets

<RELATION BETWEEN SIGNAL CARRIER AND LIGHT QUANTITY INCIDENT IN PHOTOELECTRIC CONVERSION REGION 101>

(P WELL REGION IN SUBSTRATE)

(P WELL REGION IN SUBSTRATE)

(P WELL REGION IN SUBSTRATE)

(P WELL REGION IN SUBSTRATE)

(P WELL REGION IN SUBSTRATE)

(P WELL REGION IN SUBSTRATE)

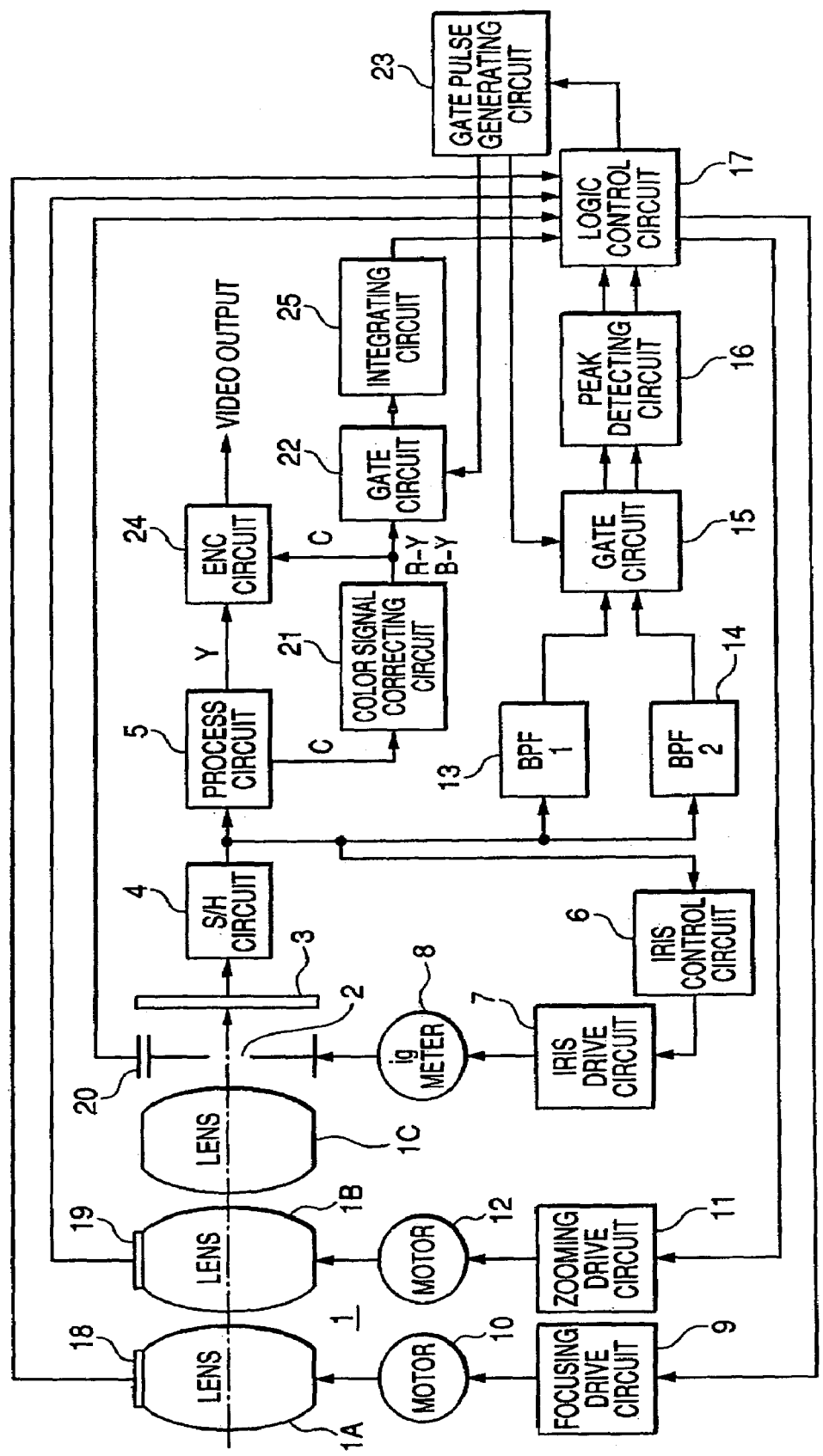

SOLID STATE IMAGE PICKUP DEVICE, METHOD OF MANUFACTURING THE SAME, AND CAMERA

BACKGROUND OF THE INVENTION

1. Field of the Invention

The present invention relates to a solid state image pickup device having a photoelectric conversion region for generating carrier by photoelectric conversion and accumulating the carrier, a method of manufacturing the solid state image pickup device, and a camera.

2. Related Background Art

In recent years, a MOS type sensor is used as a solid state image pickup device. The MOS type sensor has advantages over a CCD in that the MOS type sensor consumes lower power, requires lower drive power, and attains higher speed. It is, therefore, expected that such the MOS type sensor will grow in demand.

It is proposed to use such a MOS type sensor to expand a dynamic range of a solid state image pickup device (see Japanese Patent Application Laid-open No. 2001-186414 and U.S. Pat. No. 6,307,195 corresponding thereto). The MOS type sensor disclosed in the documents has a structure in which a plurality of pixels are arranged in a matrix. Each of the pixels has a photodiode, a floating diffusion (hereinafter also referred to FD when necessary) region, a transfer transistor for transferring carrier from the photodiode to the FD region, and a reset transistor for resetting the FD region to a predetermined potential.

In the MOS type sensor, a signal based on carrier accumulated in the photodiode is read first, and a signal based on carrier which flows out from the photodiode to be accumulated in the FD region is read. Then, the read signal is outputted through an analog amplifier.

There is also proposed another method. (See, Shigetoshi Sugawa, and 5 others, "A 100 db Dynamic Range CMOS Image Sensor Using a Lateral Overflow Integration Capacitor", ISSCC 2005/SESSION19/IMAGES/19.4, DIGEST OF TECHNICAL PAPERS, 2005 IEEE International Solid-State Circuit Conference, Feb. 8, 2005, P352–353, 603).

In the CMOS area sensor shown in the above reference, an additional capacitor having a capacitance larger than that of the FD is further formed in each pixel. One terminal of the additional capacitor is connected to the FD through a switch, and the other terminal of the additional capacitor is connected to a ground. With this structure, when strong light expels carrier to flow out from the photodiode, the additional capacitor holds the carrier which has flowed out, making it possible to output a signal according to the amount of the carrier which flows out to thereby expand the dynamic range.

However, according to the conventional art described above, when very bright (strong) incident light comes in during the photodiode generates carrier to accumulate, a large amount of carrier flows out of the photodiode, and the FD region is not sufficient to accumulate all the carrier which flows out which leads to a problem in that the dynamic range can not be expanded.

Also, it may be possible to increase the surface area of the FD region to allow, the carrier which flows out from the photodiode to be accumulated thereon. However, increasing the area is contradictory to recent demand for more integration of a solid state image pickup device, which makes it difficult to increase the area.

Also, in providing the additional capacitor, a suitable structure thereof still needs further evaluation.

SUMMARY OF THE INVENTION

The present invention is made in view of the above problems, and has an object to provide a solid state image pickup device which meets demand for more integration of the solid state image pickup device while expanding the dynamic range, a method of manufacturing the solid state image pickup device, and a camera.

A solid state image pickup device according to the present invention includes a pixel, the pixel including: a semiconductor substrate; a photoelectric conversion region for generating carrier by photoelectric conversion and accumulating the carrier; an accumulating region for accumulating the carrier generated by the photoelectric conversion; a carrier holding region for accumulating carrier flowing out from the photoelectric conversion region during the photoelectric conversion region generates and accumulates carrier, the carrier holding region being formed so as to have a trench structure formed in the semiconductor substrate; a first transfer element for transferring the carrier accumulated in the photoelectric conversion region to the accumulating region; a second transfer element for transferring the carrier accumulated in the carrier holding region to the accumulating region.

The present invention provides a method of manufacturing a solid state image pickup device including a pixel, the pixel including: a photoelectric conversion region for generating carrier by photoelectric conversion and accumulating the carrier; an accumulating region for accumulating the carrier generated by the photoelectric conversion; a carrier holding region for accumulating carrier flowing out from the photoelectric conversion region during the photoelectric conversion region generates and accumulates carrier; a first transfer element for transferring the carrier accumulated in the photoelectric conversion region to the accumulating region; a second transfer element for transferring the carrier accumulated in the carrier holding region to the accumulating region, the method being characterized by forming the carrier holding region to have a trench structure.

A camera according to the present invention includes the solid state image pickup device, a lens for focusing an optical image on the solid state image pickup device, and a diaphragm for varying light quantity that passes through the lens.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 10 is a block diagram illustrating an exemplary structure of a video camera according to a fourth embodiment of the present invention.

The accompanying drawings, which are incorporated in and constitute a part of the specification, illustrate embodiments of the invention and, together with the description, serve to explain the principles of the invention.

DESCRIPTION OF THE PREFERRED EMBODIMENTS

According to the present invention, a solid state image pickup device includes a carrier holding region for accumulating carrier which flows out from a photoelectric conversion region, and the carrier holding region is formed so as to have a trench structure, to thereby meet demand for integration of a solid state image pickup while expanding the dynamic range.

(First Embodiment)

Figure 1:
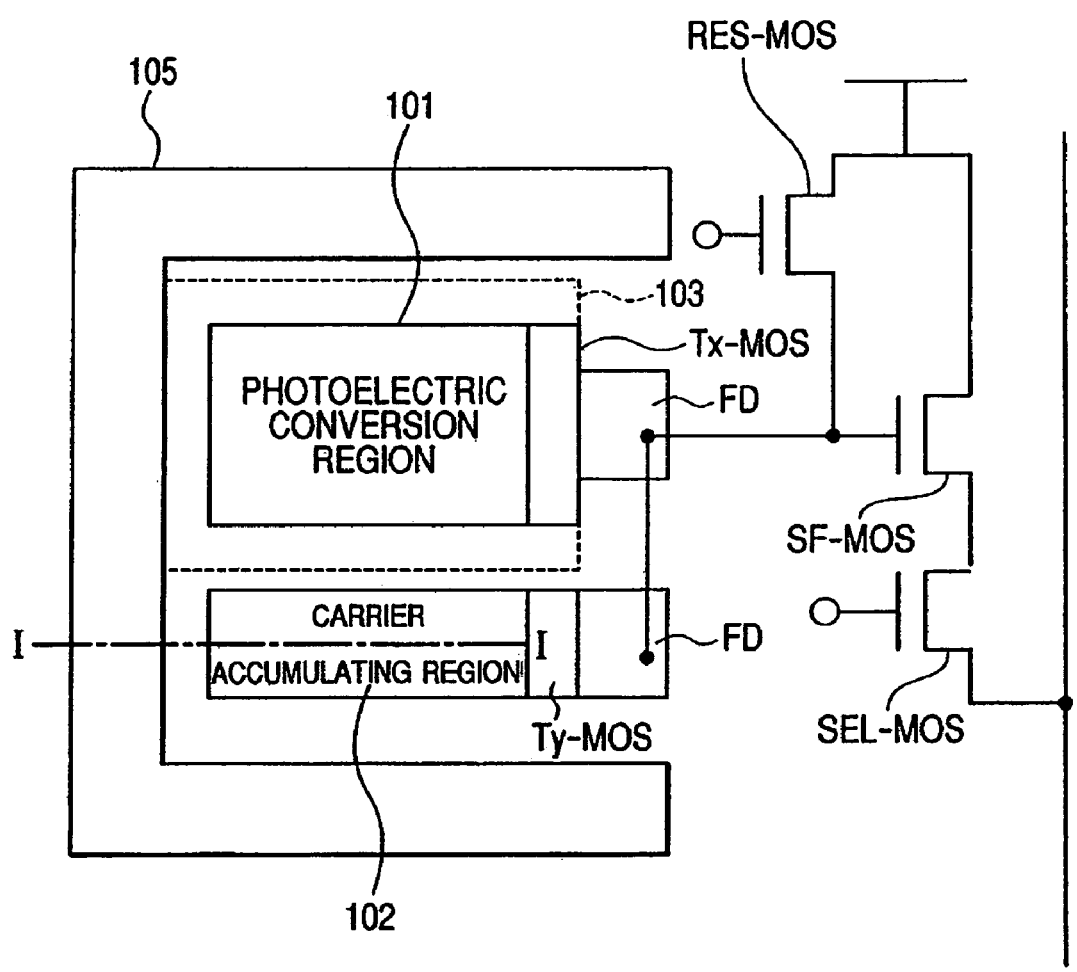
FIG. 1 illustrates an exemplary structure of a solid state image pickup device according to a first embodiment of the present invention.

FIG. 1 illustrates an exemplary structure of a solid state image pickup device according to a first embodiment of the present invention.

The solid state image pickup device includes a plurality of the pixels of FIG. 1 which are two-dimensionally arranged. An n-channel MOS field-effect transistor is hereinafter simply referred to as MOS transistor. A pixel has transfer MOS transistors Tx-MOS and Ty-MOS, a reset MOS transistor RES-MOS, a source follower MOS transistor SF-MOS, and a select MOS transistor SEL-MOS.

A source and a drain of the transfer MOS transistor Tx-MOS are connected to a photoelectric conversion region (photodiode) 101 and a floating diffusion region FD, respectively. A source and a drain of the transfer MOS transistor Ty-MOS are connected to a carrier holding region 102 and the floating diffusion region FD, respectively. An extra capacitor may be provided between the transfer MOS transistor Tx-MOS and the floating diffusion region FD.

The photoelectric conversion region 101 is structured such that an impurity region is formed on a surface of another impurity region for accumulating and holding carrier, where the two impurity regions have opposite conductivity types. The carrier holding region 102 has a trench structure which can accumulate a large amount of carrier which flows out from the photoelectric conversion region 101. The structure of the carrier holding region 102 is described in detail below. The photoelectric conversion region 101 has an opening while the carrier holding region 102 is shielded from light.

The photoelectric conversion region 101 is surrounded by a device separating region 103. The device separating portion 103 has a potential barrier to carrier accumulated in the photoelectric conversion region 101, and the potential barrier is higher than that of the photoelectric conversion region 101. Thus, the photoelectric conversion region 101 can accumulate a certain amount of carrier. The carrier holding region 102 is provided below the photoelectric conversion region 101 across the device separating region 103 as shown in FIG. 1. A device separating region 105 is provided around the photoelectric conversion region 101 and the carrier holding region 102. The device separating region 105 prevents leakage of carrier from its own pixel to an adjacent pixel.

The photoelectric conversion region 101 generates carrier by photoelectric conversion and accumulates the carrier. The floating diffusion region FD is a diffusion region for accumulating carrier and converting the carrier to voltage. A gate of the transfer MOS transistor Tx-MOS is a gate for transferring carrier generated by the photoelectric conversion region 101 to the floating diffusion region FD. Closing this transfer gate allows the photoelectric conversion region 101 to generate carrier by photoelectric conversion and to accumulate the carrier. Opening the transfer gate upon expiration of the accumulating period allows the carrier accumulated in the photoelectric conversion region 101 to be transferred (to be read) to the floating diffusion region FD.

Figure 2:
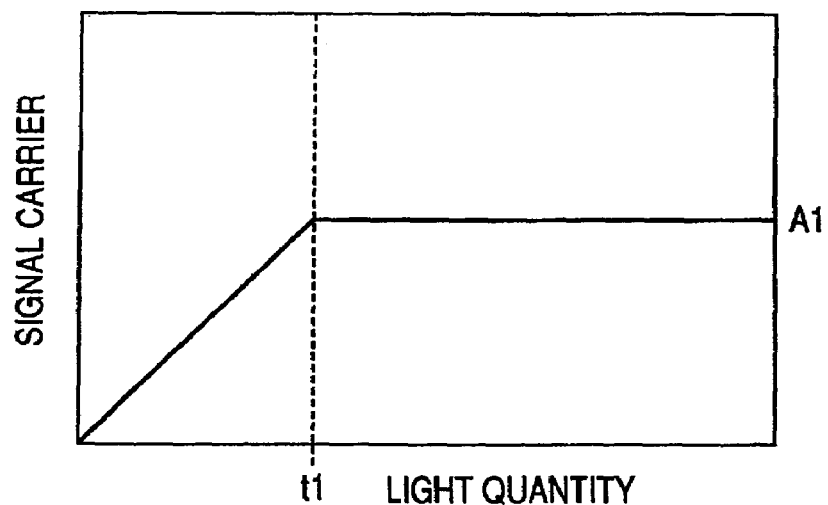
FIG. 2 is a graphic plot of a relation between a light quantity incident on a photoelectric conversion region and signal carrier.

FIG. 2 is a graphic plot of the relation between the light quantity incident on the photoelectric conversion region 101 and signal carrier.

The amount A1 of signal carrier which can be accumulated in the photoelectric conversion region 101 is fixed. Therefore, when the photoelectric conversion region 101 is irradiated with strong light, carrier flows out from the photoelectric conversion region 101 to saturate the photoelectric conversion region 101 when a light quantity reaches t1. Carrier which flows out from the photoelectric conversion region 101 flows into the carrier holding region 102.

When the photoelectric conversion region 101 is irradiated with light, carrier is accumulated in the photoelectric conversion region 101 until the light quantity reaches t1, and no carrier is accumulated in the carrier holding region 102. When the light quantity reaches t1, the photoelectric conversion region 101 is saturated, carrier which flows out from the photoelectric conversion region 101 flows into the carrier holding region 102, and the carrier holding region 102 begins to accumulate carrier. Here, the carrier holding region 102 is formed so as to have a trench structure in order to obtain a large capacitance despite its occupation of a small area.

Negative carrier which is photoelectrically converted in the photoelectric conversion region 101 is accumulated in a carrier accumulating region of a first conductivity type (n-type) of the photoelectric conversion region 101. The photoelectric conversion region 101 is connected, via a first transfer element (transfer MOS transistor Tx-MOS), to the source follower MOS transistor SF-MOS which forms a source follower amplifier. The carrier holding region 102 is connected, via a second transfer element (transfer MOS transistor Ty-MOS), to the source follower MOS transistor SF-MOS which forms a source follower amplifier. The source follower amplifier amplifies signal carrier of the photoelectric conversion region 101 and of the carrier holding region 102.

Next, the structure of the carrier holding region 102 is described.

Figure 3:
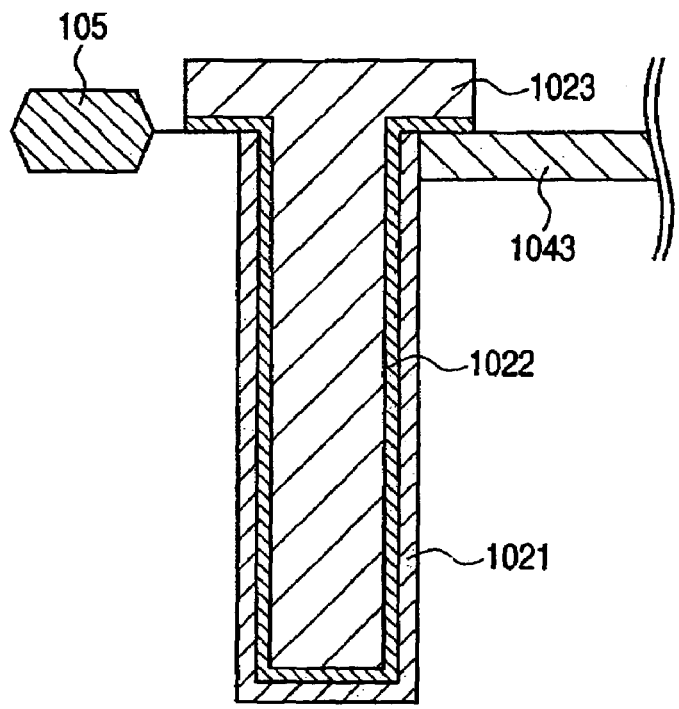
FIG. 3 is a sectional view of an exemplary structure of a carrier holding region taken along the line I—I of FIG. 1.

FIG. 3 is a sectional view of an exemplary structure of the carrier holding region 102 taken along the line I—I of FIG. 1. As illustrated in FIG. 3, the carrier holding region 102 is formed so as to have a trench structure. The device separating region 105 defines a region where the carrier holding region 102 is formed.

In the carrier holding region 102 of FIG. 3, an n⁻layer 1021 corresponding to a lower electrode is formed on side wall surfaces and a bottom surface of the trench structure. A capacitance film 1022 as a dielectric film is formed on the side wall surfaces and the bottom surface of the trench structure and on a region of the substrate where the carrier holding region 102 is formed. An upper electrode 1023 which fills the trench and protrudes from the surface of the substrate is formed on the capacitance film 1022. In FIG. 3, an n⁺layer 1043 corresponding to the source of the transfer MOS transistor Ty-MOS is formed on a portion of the substrate which is located to the right of the carrier holding region 102.

Next, a method of manufacturing the carrier holding portion 102 according to the first embodiment is described.

FIGS. 4 and 5 are schematic sectional views illustrating in order process steps of a method of manufacturing the carrier holding region 102 according to the first embodiment of the present invention. Here, FIGS. 4 and 5 illustrates the carrier holding region 102 and the transfer MOS transistor Ty-MOS adjacent to the carrier holding region 102.

Figure 4A:
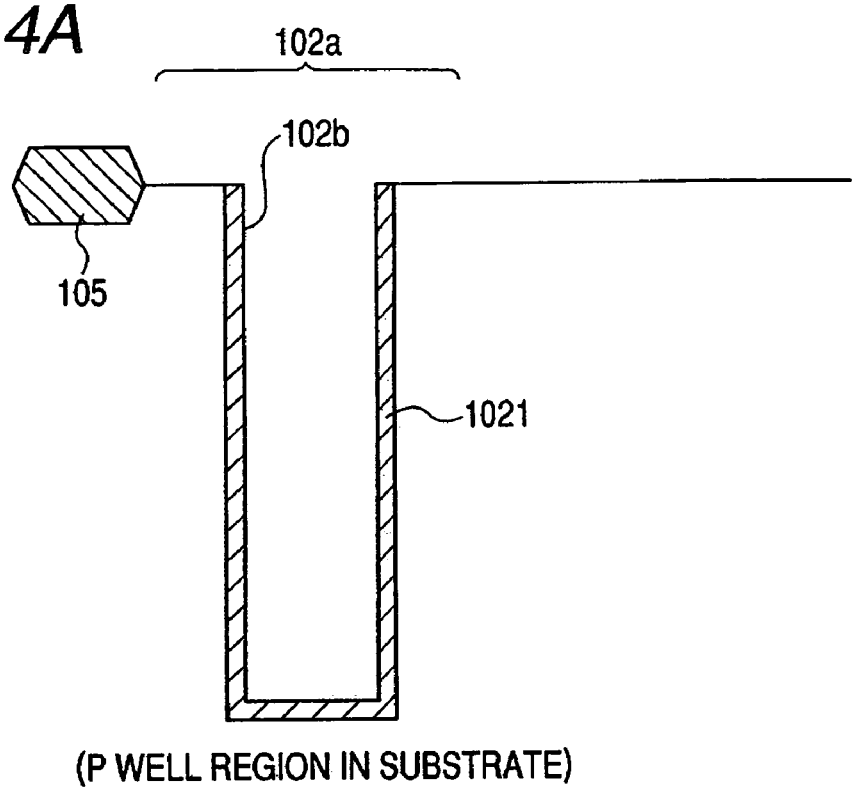
FIGS. 4A and 4B are schematic sectional views illustrating process steps of a method of manufacturing the carrier holding region in order according to the first embodiment of the present invention.

First, as illustrated in FIG. 4A, the device separating region 105 is formed on the substrate to define a region 102a where the carrier holding region is formed, and a trench 102b is formed in the region 102a where the carrier holding region is formed to form the n⁻layer 1021 on the side wall surfaces and the bottom surface of the trench 102b.

More specifically, first, the device separating region 105 is formed on the substrate by a so-called LOCOS method.

Then, a mask pattern (now shown) formed of an oxide film or a nitride film with an opening where the trench is to be formed is formed on the substrate, which is subjected to etching, to thereby form the trench 102b in the substrate. Next, impurity is introduced into the side wall surfaces and the bottom surface of the trench 102b to form the n⁻layer 1021. After that, the mask pattern (not shown) is removed.

Figure 4B:
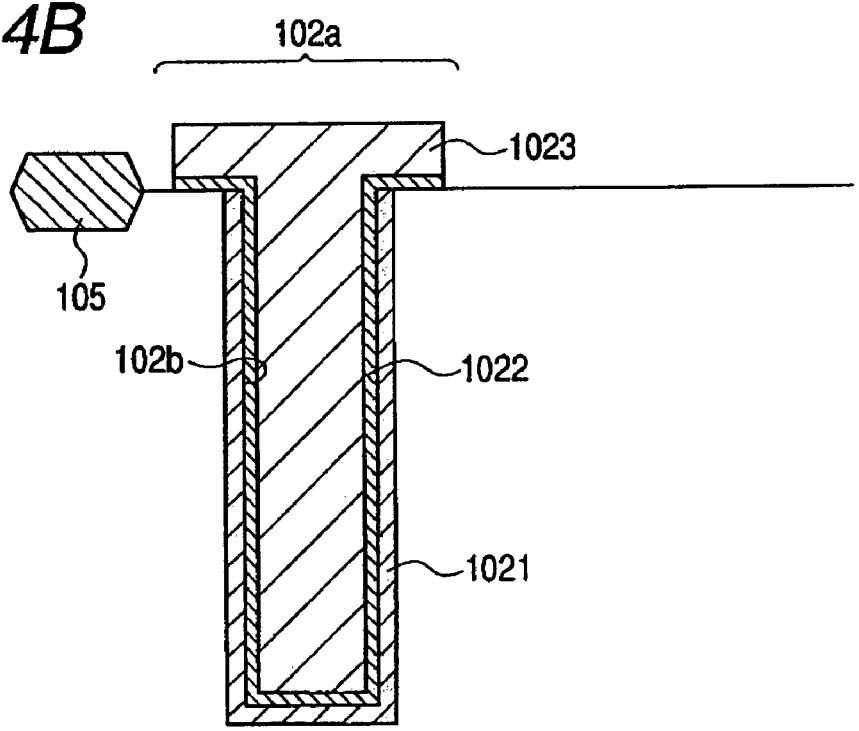

Then, as illustrated in FIG. 4B, the capacitance film 1022, which is a dielectric film, is formed on the side wall surfaces and the bottom surface of the trench 102b and on the region 102a of the substrate where the carrier holding region is formed. The trench 102b is formed on the capacitance film 1022, and the upper electrode 1023 protruding from the surface of the substrate is formed.

More specifically, the capacitance film 1022 is formed on the side wall surfaces and the bottom surface of the trench 102b and on the region 102a of the substrate where the carrier holding region is formed. The capacitance film 1022 includes, for example, a silicon oxide film or a silicon nitride film. Then, by, for example, CVD, the trench 102b is formed on the capacitance film 1022 and a polysilicon film is formed so as to protrude from the surface of the substrate. Next, dry etching is carried out with respect to the polysilicon film to form the upper electrode 1023.

Figure 5A:
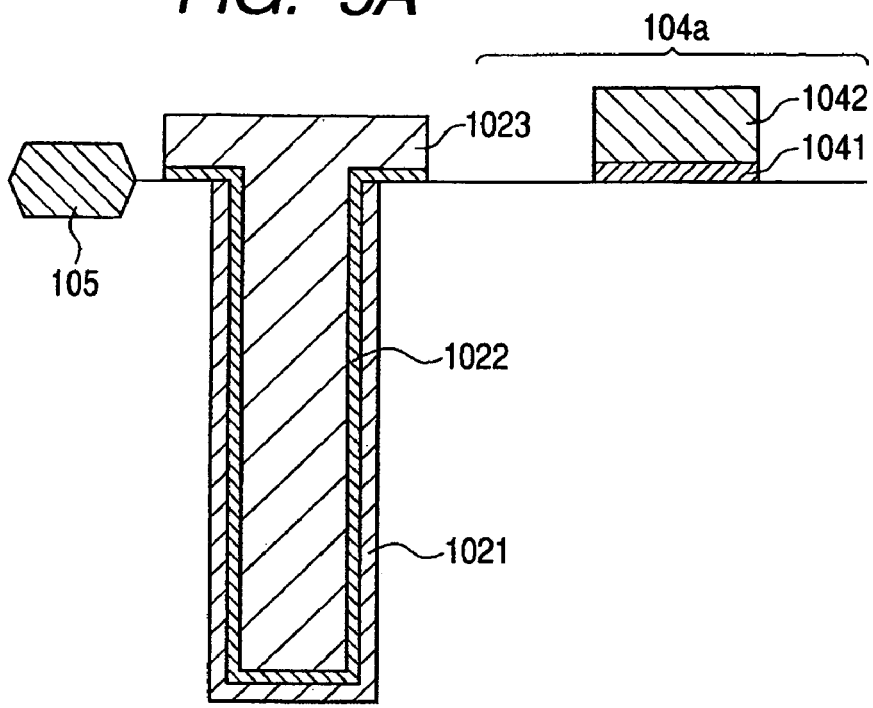
FIGS. 5A and 5B are schematic sectional views illustrating process steps of the method of manufacturing the carrier holding region in order subsequent to the process steps of FIGS. 4A and 4B according to the first embodiment of the present invention.

Then, as illustrated in FIG. 5A, a silicon oxide film and a polysilicon film are formed in the stated order on a region 104a of the substrate where the transfer MOS transistor Ty-MOS of FIG. 1 is to be formed. The silicon oxide film and the polysilicon film are processed into a predetermined shape to form a gate oxide film 1041 which is a silicon oxide film and a gate electrode 1042 which is a polysilicon film.

Figure 5B:
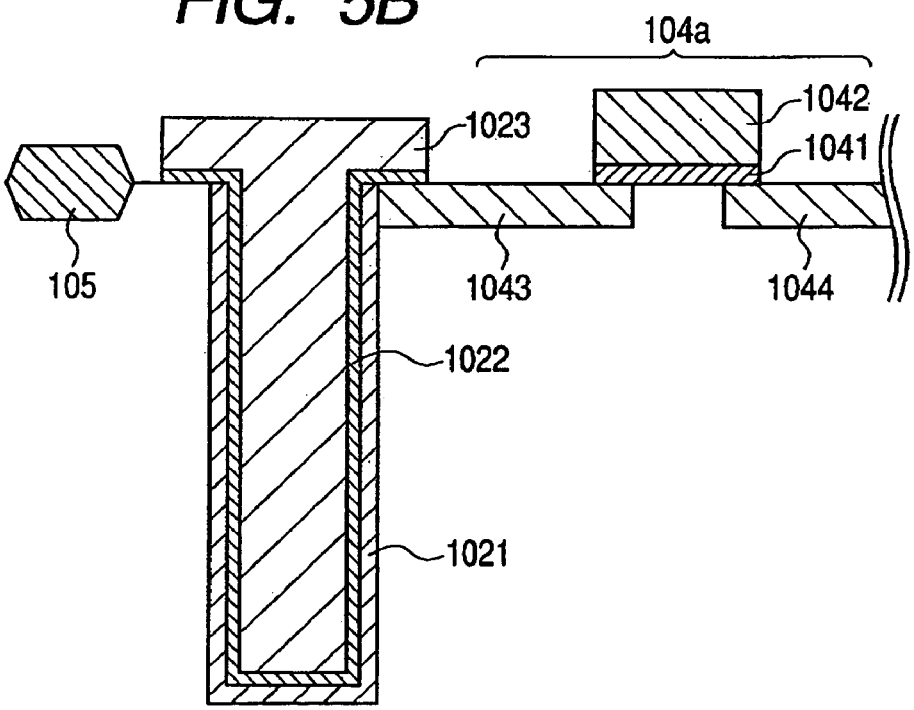

Then, as illustrated in FIG. 5B, impurity such as As is doped and diffused into the region 104a where the transfer MOS transistor Ty-MOS is to be formed to form N⁺layers 1043 and 1044 on both sides of the gate electrode 1042. The N⁺layer 1043 corresponds to the source of the transfer MOS transistor Ty-MOS while the N⁺layer 1044 corresponds to the drain of the transfer MOS transistor Ty-MOS. The N⁺layer 1043 connects the source of the transfer MOS transistor Ty-MOS and the lower electrode (n_layer 1021) of the carrier holding region 102.

The carrier holding region 102 according to the first embodiment is formed through the process steps of FIGS. 4A, 4B, 5A, and 5B. It is to be noted that the device separating region 105 may be formed after the carrier holding region 102 is formed.

Figure 6:
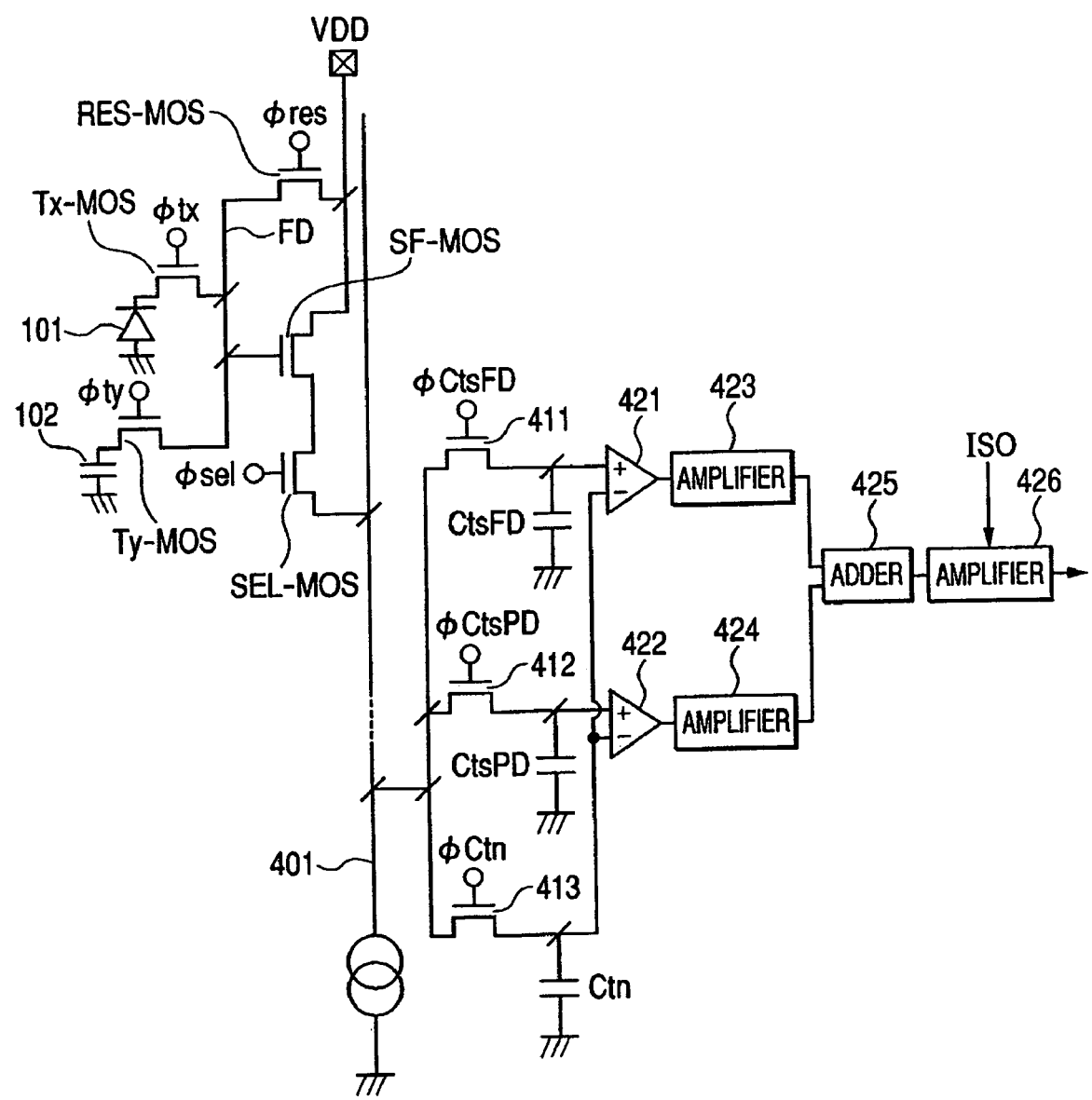
FIG. 6 is an equivalent circuit diagram of the solid state image pickup device according to the first embodiment of the present invention.

FIG. 6 is an equivalent circuit diagram of the solid state image pickup device according to the first embodiment of the present invention.

Figure 7:
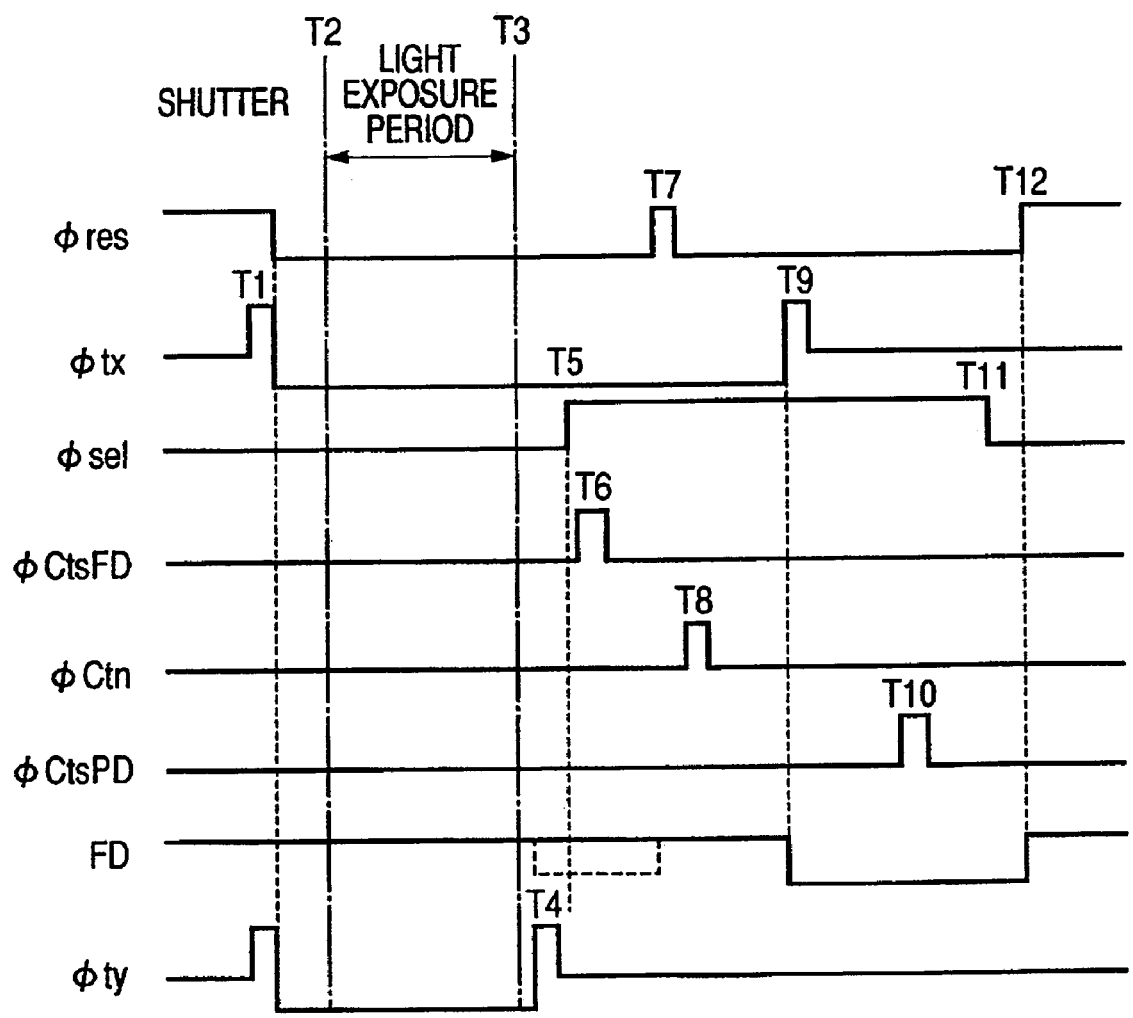
FIG. 7 is a timing chart illustrating exemplary operation of the equivalent circuit of the solid state image pickup device of FIG. 6.

FIG. 6 illustrates the pixel of FIG. 1 and a pixel signal generating region for generating a pixel signal according to carrier accumulated in photoelectric conversion region 101 and carrier accumulated in the carrier holding region 102. More specifically, in this embodiment, the pixel signal generating region includes components denoted by 411 to 413 and by 421 to 426 which are described below and capacitors CtsFD, CtsPD, and Ctn. FIG. 7 is a timing chart illustrating exemplary operation of the equivalent circuit diagram of the solid state image pickup device of FIG. 6.

A gate potential of the reset MOS transistor RES-MOS is φres, a gate potential of the transfer MOS transistor Tx-MOS is φtx, a gate potential of the transfer MOS transistor Ty-MOS is φTy, and a gate potential of the select MOS transistor SEL-MOS is φsel. A gate potential of a MOS transistor 411 is φCtsFD, a gate potential of a MOS transistor 412 is φCtsPD, and a gate potential of a MOS transistor 413 is φCtn.

In FIG. 7, before a timing T1, φres is a positive potential (potential where the transistor is turned on), and φtx, φTy, φsel, φCtsFD, φCtn, and φCtsPD are 0 V (potential where the transistors are turned off). The reset MOS transistor RES-MOS is turned on, and power supply potential VDD is supplied to the floating diffusion region FD.

Next, at the timing T1, a positive pulse is applied as φtx and φTy. The transfer MOS transistors Tx-MOS and Ty-MOS are turned on, and the floating diffusion region FD, the photoelectric conversion region 101, and the carrier holding region 102 are applied with the power supply potential VDD to be reset. After the reset, φres is decreased to 0 V to turn off the reset MOS transistor RES-MOS. φtx and sty are switched to −1.3 V, for example, to float the photoelectric conversion region 101, the carrier holding region 102, and the floating diffusion region FD. However, by this time, an outside mechanical shutter has not opened as yet, and accumulation of photoelectric carrier in the photoelectric conversion region 101 has not started.

Then, at a timing T2, a mechanical shutter 53 (FIG. 9) opens, the photoelectric conversion region 101 is irradiated with light, and the photoelectric conversion region 101 starts generation and accumulation of photoelectric carrier. When the photoelectric conversion region 101 is irradiated with weak light, the photoelectric conversion region 101 is not saturated and carrier does not flow from the photoelectric conversion region 101 into the carrier holding region 102. On the other hand, when the photoelectric conversion region 101 is irradiated with strong light, the photoelectric conversion region 101 is saturated and carrier flows from the photoelectric conversion region 101 into the carrier holding region 102.

Then, at a timing T3, the shutter 53 closes, the photoelectric conversion region 101 is shielded from light, and generation of photoelectric carrier in the photoelectric conversion region 101 ends.

Next, at a timing T4, a positive pulse is applied as φTy. The transfer MOS transistor Ty-MOS is turned on, and negative carrier accumulated in the carrier holding region 102 is read out to the floating diffusion region FD. A solid line of the potential of the floating diffusion region FD illustrates a case where weak light is irradiated and carrier does not flow from the photoelectric conversion region 101 into the carrier holding region 102. A dotted line of the potential of the floating diffusion region FD illustrates a case where strong light is irradiated and carrier flows from the photoelectric conversion region 101 into the carrier holding region 102.

When negative carrier is read out to the floating diffusion region FD from the carrier holding region 102, the potential of the floating diffusion region FD decreases.

Then, at a timing T5, φsel is switched from 0 V to a positive potential. The select MOS transistor SEL-MOS is turned on to activate a signal output line 401 in FIG. 6. The source follower MOS transistor SF-MOS forms the source follower amplifier, and outputs output voltage to the signal output line 401 according to the potential of the floating diffusion region FD.

Then, at a timing T6, a positive pulse is applied as φCtsFD. The transistor 411 is turned on, and potential of the signal output line 401 according to the potential of the floating diffusion region FD is accumulated in the capacitor CtsFD. Since carrier does not flow out into the carrier holding region 102 in a pixel where the photoelectric conversion region 101 is not saturated, output according to the reset voltage VDD of the floating diffusion region FD is accumulated in the capacitor CtsFD. When the photoelectric conversion region 101 is irradiated with strong light and the photoelectric conversion region 101 is saturated, output lower than the reset voltage VDD of the floating diffusion region FD is accumulated in the capacitor CtsFD.

Then, at a timing T7, a positive pulse is applied as φres. The reset MOS transistor RES-MOS is turned on, and the floating diffusion region FD is again reset to the power supply potential VDD.

Then, at a timing T8, a positive pulse is applied as φCtn. The MOS transistor 413 is turned on, and an offset noise voltage of the signal output line 401 when the floating diffusion region FD is reset is accumulated in the capacitor Ctn.

Next, at a timing T9, a positive pulse is applied as φtx. The transfer MOS transistor Tx-MOS is turned on, and carrier accumulated in the photoelectric conversion region 101 is read out to the floating diffusion region FD.

Then, at a timing T10, a positive pulse is applied as φCtsPD. The MOS transistor 412 is turned on, and voltage of the signal output line 401 according to the carrier read out to the floating diffusion region FD from the photoelectric conversion region 101 is accumulated in the capacitor CtsPD.

Then, at a timing T11, φsel is switched to 0 V. The select MOS transistor SEL-MOS is turned off to inactivate the signal output line 401.

Next, at a timing T12, φsel is switched to a positive potential. The reset MOS transistor RED-MOS is turned on to fix the potential of the floating diffusion region FD to the power supply potential VDD.

Through the processes described in the above, voltage corresponding to offset noise is accumulated in the capacitor Ctn, voltage corresponding to carrier which flows out from the photoelectric conversion region 101 into the carrier holding region 102 is accumulated in the capacitor CtsFD, and voltage corresponding to carrier accumulated in the photoelectric conversion region 101 is accumulated in the capacitor CtsPD.

In FIG. 6, a differential amplifier 421 outputs signal voltage obtained by subtracting noise voltage of the capacitor Ctn from the signal voltage of the capacitor CtsFD. A differential amplifier 422 outputs signal voltage obtained by subtracting noise voltage of the capacitor Ctn from the signal voltage of the capacitor CtsPD. An amplifier 423 amplifies an output signal from the differential amplifier 421. An amplifier 424 amplifies an output signal from the differential amplifier 422.

By using the same amplification circuit reading a signal of the carrier holding region 102 and a signal of the photoelectric conversion region 101 in a pixel, that is, the signals are read out to the same path, it is possible to suppress slight deviation of sensitivity, i.e., offset deviation, which would be caused if two different paths were used otherwise. As a result, amplification by an amplifier described below is made possible. In particular, in order to expand the dynamic range, an amount of the amplification by the amplifier described below needs to be increased. By using the same path for reading out signals, such amplification can be made possible.

An adder 425 adds output signals of the amplifiers 423 and 424 to output a pixel signal. Since the pixel signal is generated based on both carrier accumulated in the photoelectric conversion region 101 and carrier which flows out into the carrier holding region 102, the dynamic range of a pixel signal can be further expanded as compared with a case where only carrier accumulated in the photoelectric conversion region 101 is used.

An amplifier 426 amplifies an output signal from the adder 425 according to the ISO sensitivity to output the signal. The amplification is small when the ISO sensitivity value is low, while the amplification is large when the ISO sensitivity value is high.

According to the first embodiment, since the carrier holding region 102 is formed so as to have the trench structure of FIG. 3, a large amount of carrier which flows out from the photoelectric conversion region can be accumulated without increasing the size of pixels in a solid state image pickup device. This meets demand for integration of a solid state image pickup device while expanding the dynamic range. Further, according to the present embodiment, since the carrier holding region 102 is formed through a minimum number of steps, i.e., steps of forming the trench, forming the lower electrode (n⁻ layer 1021), forming the capacitance film 1022, and forming the upper electrode 1023, the formation can be carried out without complicating the manufacturing process.

(Second Embodiment)

Figure 8:
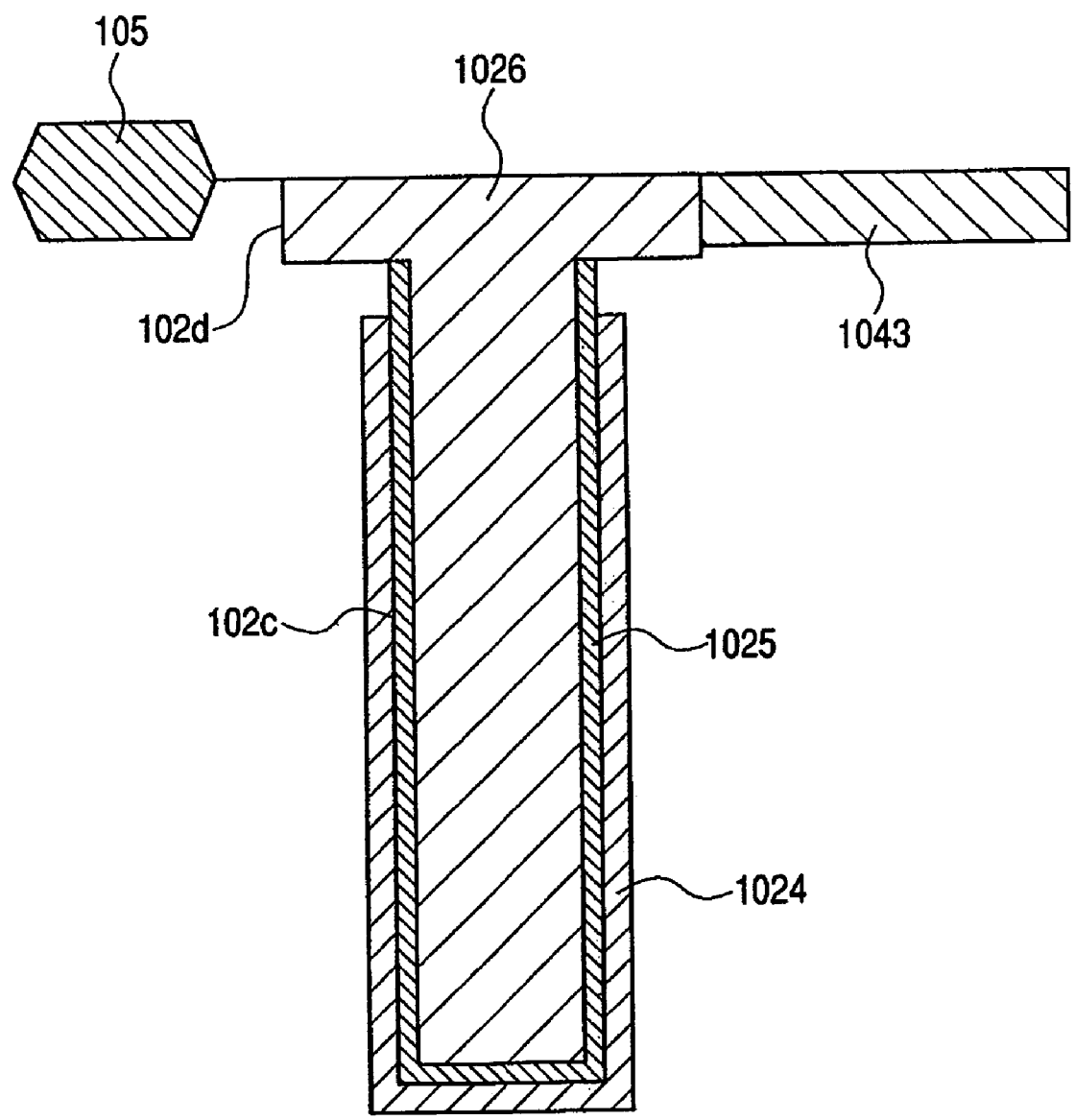
FIG. 8 illustrates an exemplary structure of a carrier holding region of a solid state image pickup device according to a second embodiment of the present invention.

FIG. 8 illustrates an exemplary structure of a carrier holding region of a solid state image pickup device according to a second embodiment of the present invention. FIG. 8 is a sectional view taken along the line I—I of the carrier holding region 102 of FIG. 1. The carrier holding region 102 of the present embodiment is, similarly to that of the first embodiment of FIG. 3, formed so as to have a trench structure. A device separating region 105 defines a region for forming the carrier holding region 102.

In the carrier holding region 102 in the second embodiment, a p⁻ layer 1024 as a lower electrode is formed on side wall surfaces and a bottom surface of a first trench 102c. The p⁻layer 1024 is connected to a p-well layer of a substrate. A capacitance film 1025 is formed on the side wall surfaces and the bottom surface of the first trench 102c. The capacitance film 1025 includes, for example, a silicon oxide film or a silicon nitride film.

An upper electrode 1026 is formed to be embedded in the substrate so as to cover the capacitance film 1025 and so as to fill the second trench 102d formed adjacent to the surface of the substrate. The upper electrode 1026 includes, for example, polysilicon. The carrier holding region 102 of the second embodiment is composed of an n⁺layer 1043 corresponding to the source of the transfer MOS transistor Ty-MOS and the upper electrode 1026 which are connected to each other.

According to the second embodiment, since the carrier holding region 102 is formed so as to have the trench structure of FIG. 8, a large amount of carrier which flows out from the photoelectric conversion region can be accumulated without increasing the size of pixels in the solid state image pickup device. This meets demand for integration of a solid state image pickup device, while expanding the dynamic range. Further, according to the present embodiment, since the upper electrode 1026 of the carrier holding region 102 is embedded in the substrate, it can be easily connected to the transfer MOS transistor Ty-MOS.

(Third Embodiment)

Figure 9:
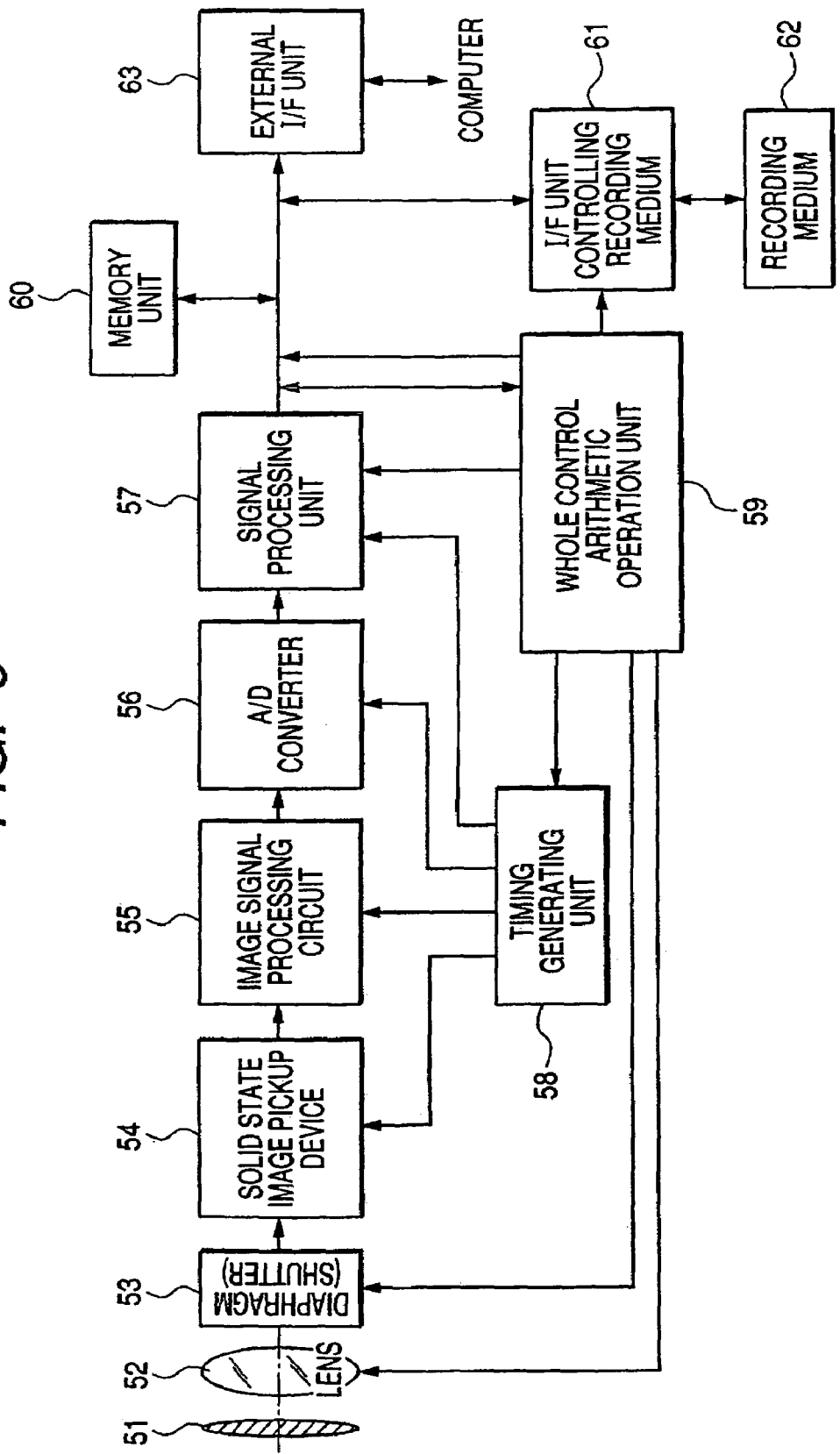
FIG. 9 is a block diagram illustrating an exemplary structure of a still video camera according to a third embodiment of the present invention.

FIG. 9 is a block diagram illustrating an exemplary structure of a still video camera according to a third embodiment of the present invention. An exemplary case where the solid state image pickup device according to the first and second embodiments is applied to a still video camera is now described in detail with reference to FIG. 9. Here, the solid state image pickup device according to the first and second embodiments corresponds to a solid state image pickup element 54 and an image signal processing circuit 55.

In FIG. 9, a reference numeral 51 denotes a barrier which serves both as a lens protection and as a main switch, a reference numeral 52 denotes a lens for focusing an optical image of a subject on the solid state image pickup element 54, a reference numeral 53 denotes a diaphragm and a shutter for varying light quantity that passed through the lens 52, a reference numeral 54 denotes the solid state image pickup element for capturing an image signal of a subject focused by the lens 52, a reference numeral 55 denotes the image pickup signal processing circuit for carrying out analog signal processing of an image pickup signal (image signal) outputted from the solid state image pickup element 54, a reference numeral 56 denotes an A/D converter for carrying out analog-digital conversion of an image signal outputted from the image signal processing circuit 55, a reference numeral 57 denotes a signal processing unit for making various corrections on image data outputted from the A/D converter 56 and for performing data compression, a reference numeral 58 denotes a timing generating unit for outputting various kinds of timing signals to the solid state image pickup element 54, the image signal processing circuit 55, the A/D converter 56, and the signal processing unit 57, a reference numeral 59 denotes a whole control arithmetic operation unit for carrying out various kinds of arithmetic operations and for controlling the whole of the still video camera, a reference numeral 60 denotes a memory unit for temporarily storing image data, a reference numeral 61 denotes an I/F unit controlling recording medium for writing data into or reading data from a recording medium 62, a reference numeral 62 denotes a detachable recording medium such as a semiconductor memory for writing or reading image data, and a reference numeral 63 denotes an external I/F unit for communicating with an external computer or the like.

Next, operation for image taking performed by the still video camera having the structure as described in the above is described. When the barrier 51 is opened, a main power supply is switched on, then a power supply for a control system is switched on, and further, a power supply for an image pickup circuit system such as the A/D converter 56 is switched on. Then, in order to control an exposure, the whole control arithmetic operation unit 59 opens the diaphragm 53. A signal outputted from the solid state image pickup element 54 goes through the image signal processing circuit 55, and, after being converted in the A/D converter 56, inputted to the signal processing unit 57. Based on this data, exposure is calculated by the whole control arithmetic operation unit 59. According to the result of the metering obtained through the calculation of the exposure, the brightness is evaluated, and the whole control arithmetic operation unit 59 adjusts the diaphragm 53 accordingly.

Next, based on a signal outputted from the solid state image pickup element 54, a high-frequency component is taken out and the whole control arithmetic operation unit 59 calculates the distance to the subject. After that, the lens is driven to obtain correct focus and it is judged whether the image is in focus or not. When it is determined that the image is out of focus, the lens is driven again to measure the distance. After it is confirmed that focus is achieved, the shutter 53 is opened and real exposure starts. When the exposure ends, an image signal outputted from the solid state image pickup element 54 goes through the image signal processing circuit 55, is A/D converted in the A/D converter 56, goes through the signal processing unit 57, and is written into the memory unit 60 by the whole control arithmetic operation unit 59. After that, under control of the whole control arithmetic operation unit 59, data accumulated in the memory unit 60 goes through the I/F unit controlling recording medium 61 and is stored in the detachable recording medium 62 such as a semiconductor memory. Alternatively, data may go through an external I/F unit 63 to be directly inputted to a computer or the like for processing an image.

The timing generating portion 58 controls signals of potentials such as φres, φtx, φTy, φsel, φctsFD, φCtn, and φCtsPD of FIG. 7.

(Fourth Embodiment)

FIG. 10 is a block diagram illustrating an exemplary structure of a video camera according to a fourth embodiment of the present invention. An exemplary case where the solid state image pickup device according to the first and second embodiments is applied to a video camera is now described in detail with reference to FIG. 10. Here, the solid state image pickup device according to the first and second embodiments corresponds to a solid state image pickup element 3.

A reference numeral 1 denotes an image taking lens which includes a focus lens 1A for adjusting focus, a zoom lens for carrying out zooming operation, and a lens 1C for focusing. A reference numeral 2 denotes a diaphragm and a shutter, a reference numeral 3 denotes the solid state image pickup element for carrying out photoelectric conversion of an image of a subject focused on an image pickup plane to convert the image to an electric image signal, a reference numeral 4 denotes a sample-and-hold circuit (S/H circuit) for holding a sample of an image signal outputted from the solid state image pickup element 3 and for amplifying the level of the signal to output an image signal.

A reference numeral 5 denotes a process circuit for processing an image signal outputted from the S/H circuit 4 in predetermined ways such as gamma correction, color separation, and blanking to output an intensity signal Y and a chroma signal C. A color signal correcting circuit 21 makes a correction to white balance and color balance of a chroma signal C outputted from the process circuit 5 to be outputted as color-difference signals R-Y and B-Y.

An intensity signal Y outputted from the process circuit 5 and color-difference signals R-Y and B-Y outputted from the color signal correcting circuit 21 are modulated by an encoder circuit (ENC circuit) 24 to be outputted as standard television signals and supplied to a video recorder or an electronic view finder (EVF) such as an electronic view finder as a monitor.

A reference numeral 6 denotes an iris control circuit for controlling an iris drive circuit 7 based on an image signal supplied from the S/H circuit 4 and for automatically controlling an ig meter 8 to control the degree of opening of the diaphragm 2 such that the level of an image signal is a fixed value of a predetermined level.

Reference numerals 13 and 14 denote band-pass filters (BPFs) each having the band limit different from each other for extracting, from an image signal outputted from the sample-and-hold circuit 4, a high-frequency component necessary for detecting whether an image is in focus or not. Signals outputted from the first band-pass filter 13 (BPF 1) and the second band-pass filter 14 (BPF 2) are gated by a gate circuit 15 and a focus gate frame signal, respectively, and peak values are detected and held by a peak detecting circuit 16 and are inputted to a logic control circuit 17. The signals are referred to as focus voltage, and the focus voltage is used to adjust focus.

A reference numeral 18 denotes a focus encoder for detecting a place to which the focus lens 1A moves, a reference numeral 19 denotes a zoom encoder for detecting the focal length of the zoom lens 1B, and a reference numeral 20 denotes an iris encoder for detecting the degree of opening of the diaphragm 2. Values detected by these encoders are supplied to the logic control circuit 17 for carrying out system control.

The logic control circuit 17 detects whether the subject is in focus or not and adjust the focus based on an image signal corresponding to a set region within which it is detected that the subject is in focus. More specifically, the logic control circuit 17 takes in peak value information of high-frequency components supplied by the band-pass filters 13 and 14, and supplies, in order to drive the focus lens 1A to a place where the maximum peak value of the high-frequency component can be obtained, a control signal with regard to the direction of rotation, the speed of rotation, rotation/stop, and the like of a focus motor 10, to thereby control the focus motor 10.

When zooming is instructed, a zooming drive circuit 11 rotates a zooming motor 12. Rotation of the zooming motor 12 moves the zooming lens 1B to carry out zooming.

As described in the above, according to the first to fourth embodiments, the photoelectric conversion region 101 generates carrier by photoelectric conversion and accumulates the carrier. The carrier holding region 102 is formed so as to have a trench structure. During the photoelectric conversion region 101 generates and accumulates carrier, the carrier holding region 102 accumulates carrier which flows out from the photoelectric conversion region 101. The transfer MOS transistor Tx-MOS is the first transfer element for transferring carrier accumulated in the photoelectric conversion region 101 to the source follower amplifier SF-MOS. The transfer MOS transistor Ty-MOS is the second transfer element for transferring carrier accumulated in the carrier holding region 102 to the source follower amplifier SF-MOS.

It is to be noted that the above embodiments have merely been shown as examples of embodying the present invention, and are not to be construed as limiting the technical scope of the present invention. That is, various modifications and variations are possible without departing from the technical idea or main features of the present invention as defined in the following claims.

This application claims priority from Japanese Patent Application No. 2005-080346 filed on Mar. 18, 2005, which is hereby incorporated by reference herein.

What is claimed is:

1. A solid state image pickup device comprising a pixel, the pixel comprising:
   a semiconductor substrate;
   a photoelectric conversion region for generating carriers by photoelectric conversion and accumulating the carriers;
   an accumulating region for accumulating the carrier generated by the photoelectric conversion;
   a carrier holding region for accumulating carrier flowing out from the photoelectric conversion region, the carrier holding region being formed so as to have a trench structure formed in the semiconductor substrate;
   a first transfer element for transferring the carrier accumulated in the photoelectric conversion region to the accumulating region;
   a second transfer element for transferring the carrier accumulated in the carrier holding region to the accumulating region.

2. A solid state image pickup device according to claim 1, wherein the accumulating region is a floating diffusion region.

3. A solid state image pickup device according to claim 1, wherein the trench structure of the carrier holding region comprises a structure wherein a trench is formed in the semiconductor substrate, an insulating region is formed on side walls and a bottom of the trench, and an electrode member is formed in the trench.

4. A solid state image pickup device according to claim 3, wherein the trench structure is formed in a first semiconductor region of a first conductivity type, and a second semiconductor region of a second conductivity type is formed between the first semiconductor region and the insulating region, the second semiconductor region being connected to a source or a drain of a MOS transistor for reading out carrier from the carrier holding region.

5. A solid state image pickup device according to claim 3, wherein the trench structure is formed in a first semiconductor region of a first conductivity type, and a second semiconductor region of the first conductivity type is formed between the first semiconductor region and the insulating region, the second semiconductor region having an impurity concentration lower than an impurity concentration of the first semiconductor region, the first semiconductor region being connected to a source or a drain of a MOS transistor for reading out carrier from the carrier holding region.

6. A solid state image pickup device according to claim 1, further comprising a pixel signal generating region for generating a pixel signal according to carrier accumulated in the photoelectric conversion region and carrier accumulated in the carrier holding region.

7. A solid state image pickup device according to claim 1, wherein the photoelectric conversion region has an opening and the carrier holding region is shielded from light.

8. A camera, comprising:
a solid state image pickup device according to claim 1;
a lens for focusing an optical image on the solid state image pickup device; and
a diaphragm for varying light quantity that passes through the lens.

\* \* \* \* \*

UNITED STATES PATENT AND TRADEMARK OFFICE
CERTIFICATE OF CORRECTION

PATENT NO. : 7,205,523 B2
APPLICATION NO. : 11/369819
DATED : April 17, 2007
INVENTOR(S) : Ryuichi Mishima et al.

It is certified that error appears in the above-identified patent and that said Letters Patent is hereby corrected as shown below:

ON TITLE PAGE AT ITEM (57) ABSTRACT

Line 6, "during" should read --while--.

COLUMN 1

Line 55, "during" should read --while--.

COLUMN 2

Line 16, "during" should read --while--;
    Line 22, "region;" should read --region; and--;
    Line 32, "during" should read --while--; and
    Line 36, "region;" should read --region; and--.

COLUMN 5

Line 22, "illustrates" should read --illustrate--.

COLUMN 6

Line 5, "(n_layer" should read --(n⁻layer--;
    Line 30, "is $\phi Ty$," should read --is $\phi ty$,--;
    Line 36, "$\phi Ty$," should read --$\phi ty$,--;
    Line 42, "and $\phi Ty$." should read --and $\phi ty$.--; and
    Line 47, "sty" should read --$\phi ty$--.

COLUMN 7

Line 5, "as $\phi Ty$." should read --as $\phi ty$--.

COLUMN 10

Line 53, "$\phi Ty$," should read --$\phi ty$,--.

UNITED STATES PATENT AND TRADEMARK OFFICE
CERTIFICATE OF CORRECTION

PATENT NO. : 7,205,523 B2
APPLICATION NO. : 11/369819
DATED : April 17, 2007
INVENTOR(S) : Ryuichi Mishima et al.

It is certified that error appears in the above-identified patent and that said Letters Patent is hereby corrected as shown below:

<u>COLUMN 11</u>

Line 51, "adjust" should read --adjusts--.

<u>COLUMN 12</u>

Line 37, "region;" should read --region; and--.

Signed and Sealed this

Thirteenth Day of May, 2008

JON W. DUDAS
*Director of the United States Patent and Trademark Office*